(12) United States Patent
Bager

(10) Patent No.: US 7,129,710 B2
(45) Date of Patent: Oct. 31, 2006

(54) PRINTED CIRCUIT CARD

(75) Inventor: Ralf Bager, Oberursel (DE)

(73) Assignee: Diehl Avionik Systeme GmbH, Ueberlingen (DE)

( * ) Notice: Subject to any disclaimer, the term of this patent is extended or adjusted under 35 U.S.C. 154(b) by 0 days.

(21) Appl. No.: 11/178,772

(22) Filed: Jul. 11, 2005

(65) Prior Publication Data

US 2006/0006878 A1    Jan. 12, 2006

(30) Foreign Application Priority Data

Jul. 9, 2004    (DE) .................... 10 2004 003 261

(51) Int. Cl.
*G01R 31/08* (2006.01)
(52) U.S. Cl. ..................... 324/525; 324/551
(58) Field of Classification Search ............. None
See application file for complete search history.

(56) References Cited

U.S. PATENT DOCUMENTS

| | | | |
|---|---|---|---|
| 4,504,782 A * | 3/1985 | Zbinden | ..... 324/551 |
| 4,567,428 A | 1/1986 | Zbinden | |
| 6,040,530 A | 3/2000 | Wharton et al. | |
| 2005/0275552 A1* | 12/2005 | Chamberlin et al. | ..... 340/647 |

FOREIGN PATENT DOCUMENTS

| | | |
|---|---|---|
| DE | 199 10 407 A1 | 9/2000 |
| DE | 299 23 733 U1 | 3/2001 |
| EP | 0 926 930 A2 | 6/1999 |
| GB | 2 314 699 A | 1/1998 |
| JP | 7-321427 | 12/1995 |

* cited by examiner

*Primary Examiner*—Vincent Q. Nguyen
(74) *Attorney, Agent, or Firm*—Laurence A. Greenberg; Werner H. Stemer; Ralph E. Locher

(57) ABSTRACT

A printed circuit card made of plastic has a carbonization sensor for protection against smoldering electrical fires. The carbonization sensor contains a first and a second conductor track disposed on the printed circuit card and also a monitoring device. The two conductor tracks are electrically insulated from one another by the plastic, and the monitoring device monitors an insulating state of the two conductor tracks in relation to one another and produces a fault signal. Local overheating of the printed circuit card is detected at an early time by the carbonization sensor, before an avalanche effect caused by the carbonization, which makes the printed circuit card electrically conductive, leads to a smoldering electrical fire.

11 Claims, 3 Drawing Sheets

PRINTED CIRCUIT CARD

BACKGROUND OF THE INVENTION

Field of the Invention

The invention relates to a printed circuit card made of plastic having protection against smoldering electrical fires.

The printed circuit card, i.e. an insulating element for supporting electronic components and conductor tracks, generally is formed of plastic. Because of the heat that is introduced during soldering operations, the plastic is, in particular, a thermosetting plastic. Usually, an epoxy resin reinforced with glass fibers is used.

In many electrical or electronic circuits, a defective electronic component causes the risk of fire or smoke developing. In particular with component loading techniques (adhesive bonding, SMD), an electronic component is no longer kept away from the printed circuit card by legs, but instead lies directly on it. A consequence of this is that a defective, overheating component causes a great amount of heat to be introduced into the printed circuit card.

As from a certain temperature, the heat introduced causes so-called carbonization of the printed circuit card. The heat exposure has the effect of changing the chemical structure of the plastic (it "carbonizes"), whereby its original insulating properties are lost. The printed circuit card itself becomes electrically conductive, and thereby becomes an electrical consumer. Though the actual risk posed by a heated component is still manageable, the carbonization causes an avalanche effect. The electrical energy drawn by the conductivity of the printed circuit card additionally induces heat, which triggers a self-feeding process, which, by covering a large surface area, spreads over the entire printed circuit card. This produces large amounts of smoke and toxic fumes as long as the current supply is not interrupted.

Known for detecting such smoldering electrical fires are smoke detectors, which report the presence of smoke or certain gases in the air, or temperature monitors, which detect an abnormal increase in temperature. Devices of this type disadvantageously respond only relatively late to a smoldering electrical fire. Moreover, they are not able to locate the position of the fire precisely. Furthermore, great expenditure on sensors is required. For applications in which electrically caused smoke must be avoided under all circumstances because of the risk of personal injury, for example in aviation, such devices can therefore only be used to a restricted extent.

Furthermore, it is known to avoid fires by providing a current limiter in the electrical supply to a circuit configuration. However, such a current limiter disadvantageously works only under low nominal currents, so that the increased current flow in the defective component or the carbonization currents induced by the carbonization constitute a notable proportion of the current flow. Under such conditions, carbonization of the printed circuit card is in any case rather rare on account of the limited component currents.

SUMMARY OF THE INVENTION

It is accordingly an object of the invention to provide a printed circuit card which overcomes the above-mentioned disadvantages of the prior art devices of this general type, which has reliable and rapid protection against smoldering electrical fires. A smoldering fire is to be detected quickly enough that the printed circuit card concerned can be disconnected from the electrical supply before electrically caused smoke becomes hazardous. The avalanche effect is to be prevented at an early time.

With the foregoing and other objects in view there is provided, in accordance with the invention, a printed circuit card. The printed circuit card has a printed circuit card body made of plastic and a carbonization sensor for protection against smoldering electrical fires and disposed on the printed circuit card body. The carbonization sensor has a first conductor track and a second conductor track disposed on the printed circuit card body, and the first and second conductor tracks are electrically insulated from one another by the plastic. A monitoring device is connected to the carbonization sensor. The monitoring device monitors an insulating state of the first and second conductor tracks in relation to one another and produces a fault signal if the insulating state is violated.

The invention is based here on the realization that carbonization makes the printed circuit card become an electrical conductor. If the development of heat of a defective component leads to increased heat being introduced into the printed circuit card, and thereby to carbonization, at this point the insulating property of the printed circuit card is lost. If the material of the printed circuit card is used for insulating two conductor tracks from one another, the carbonization can be detected on the basis of a change in the insulating state or the electrical resistance of the conductor tracks in relation to one another. This happens long before the occurrence of flames over a large area of the printed circuit card leads to a detectable amount of smoke and toxic fumes. The insulating state of the conductor tracks in relation to one another is a reliable measured variable for detecting the carbonization of the printed circuit card.

The conductor tracks may in this case be formed as conductor tracks in the narrower sense, but also as two-dimensional formations, also referred to as "planes".

By use of the fault signal, which is generated by the monitoring device for monitoring the insulating state of the conductor tracks, carbonization information can be further evaluated. In this way, the risk of the electrical fire spreading in the manner of an avalanche can be reliably avoided. For example, the fault signal can be used for blocking the current supply for the printed circuit card.

The conductor tracks may be disposed locally in the vicinity of power components. It is also possible to provide the entire printed circuit card, just a sector of it or a number of sectors of it with the conductor tracks. The conductor tracks may be concentrated in groups or configured in a sinuous manner. The conductor tracks may be laid on the printed circuit card or in the printed circuit card. For production engineering reasons, it is appropriate to apply or incorporate the conductor tracks of the carbonization sensor in an integrated manner with the other conductor tracks of the printed circuit card during production. Any customary material for conductor tracks, in particular a copper alloy, may be used as the material.

The monitoring device may itself be a component part of the printed circuit card. It may, however, also be configured as a separate element. In the former case, which is appropriate when there are free locations on the printed circuit card, the fault signal produced by the monitoring device is routed to the outside for further evaluation. In the latter case, the conductor tracks are simply connected to the external monitoring device by connecting cables.

The invention makes the detection of carbonization on the printed circuit card possible before electrical smoke becomes hazardous or endangers human life. Targeted local displacement of the conductor tracks allows an affected sector of a circuit configuration to be disconnected before greater consequential damage occurs.

In particular in aviation or in other applications where safety is highly relevant, and in which electrical or electronic circuits are of a redundant configuration, rapid and locally limited disconnection of individual affected sectors is made possible with a printed circuit card having a carbonization sensor of this type before smoke or further damage such as destruction of the entire electronics occurs. The work of the defective sector is taken over by the redundant system. The defective sector must continue in operation for a while before it can be exchanged. The avalanche effect, which can, inter alia, lead to flight safety being put at risk, is reliably avoided.

The fault signal is advantageously routed into a protective device, which in the presence of the fault signal interrupts the electrical supply. In this way, the disconnection of the affected sector or the affected printed circuit card is automatically carried out as soon as the fault signal is present. This can be accomplished by a simple electronic circuit. The fault signal of the monitoring device may be produced for example when the ohmic resistance of the conductor tracks in relation to one another falls below a value between several kΩ and several MΩ, preferably between 10 and 100 kΩ.

If power components, which of course develop a great amount of heat, are present on the printed circuit card, it is recommended to route the sensor-related conductor tracks in such a way that they pass close by the components to be monitored.

A printed circuit card is often of a multilayered construction and contains a number of layers with respective conductor or circuit tracks and components. It is not uncommon for there to be up to 16 layers. Customary printed circuit cards contain for instance 4 inner layers and 2 outer layers. The conductor tracks of the carbonization sensor are expediently laid in an inner layer. The carbonization sensor may then be created inexpensively in the production process of the printed circuit card by an additional inner layer. The conductor tracks may in this case be located at the components to be monitored, without it being necessary—as would be the case with a single-layered printed circuit card—to make allowance directly for conductor tracks that are already in the same layer, to construct the circuit configuration with electrical contact between the components.

For measurements of the insulating state of the conductor tracks on the basis of their ohmic resistance in relation to one another, it is advantageous if one conductor track is formed so as to cover a surface area and the other conductor track is formed opposite it and in the form of a grid or mesh. Every local change in the insulating property of the plastic of the printed circuit card lying between the two conductor tracks formed in this way has a direct effect on the resistance between the conductor tracks. Alternatively, both conductor tracks may be configured in the form of a grid or mesh.

For the detection of local carbonization effects by use of the conductor tracks, it is advisable to configure the two conductor tracks in a comb-like manner in relation to one another. This has the advantage in particular that is possible with an inner layer for the upper side and underside of the loaded printed circuit card to be monitored simultaneously.

A simple and inexpensive monitoring device is a D.C. circuit, which detects the ohmic resistance between the conductor tracks and produces the fault signal when it falls below a prescribed minimum resistance. A value between 10 and 100 kΩ is recommendable as the minimum resistance.

For system decoupling between the printed circuit card and the monitoring device, it is advantageous to create the monitoring device as an A.C. circuit. The capacitance formed by the conductor tracks of the carbonization sensor is expediently wired with the inductance of a transformer to form an oscillating circuit, which is excited by the transformer via a detector circuit. The oscillating behavior of the oscillating circuit is detected by the detector circuit. A reduction in the resistance of the conductor tracks in relation to one another leads to a damping of the oscillating circuit and to breaking off of the oscillation. A fault signal is produced at the latest when the oscillation breaks off.

It is favorable in terms of energy if the detector circuit is operated at the resonant frequency of the oscillating circuit. Less electrical energy is necessary for exciting the oscillating circuit oscillating in a damped manner. The transformer of the A.C. circuit can in this case be disposed directly on the printed circuit card body.

Other features which are considered as characteristic for the invention are set forth in the appended claims.

Although the invention is illustrated and described herein as embodied in a printed circuit card, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
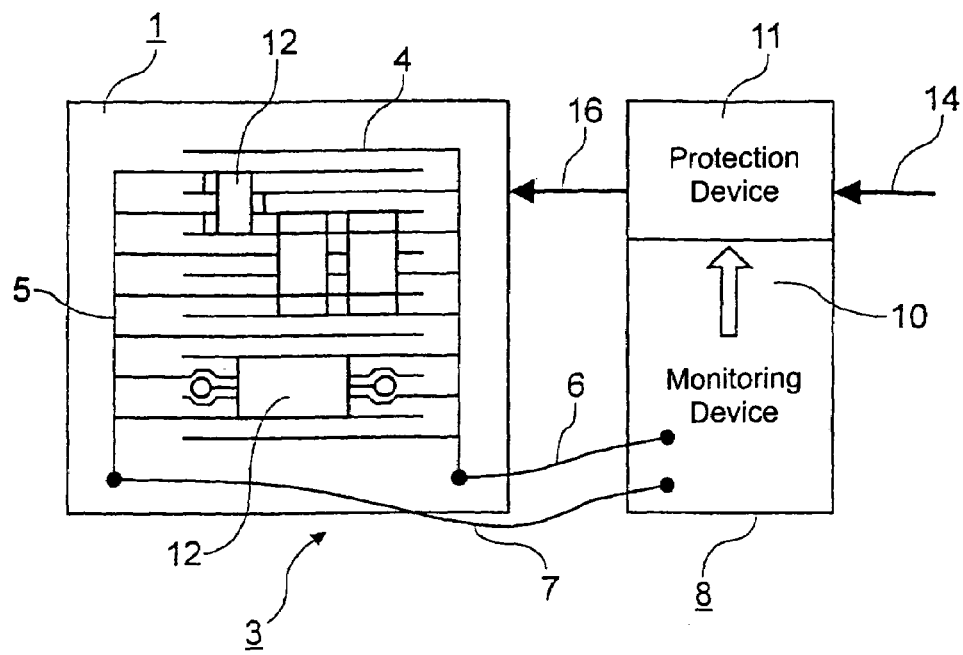
FIG. 1 is a schematic view of a printed circuit card with a carbonization sensor and a monitoring device, which in the event of a fire interrupts the electrical supply, according to the invention.

Referring now to the figures of the drawing in detail and first, particularly, to FIG. 1 thereof, there is shown a printed circuit card 1 made of plastic with a carbonization sensor 3. The carbonization sensor 3 contains a first conductor track 4 and a second conductor track 5, which have been applied to a surface of the printed circuit card 1. Alternatively, the conductor tracks 4, 5 can also be applied to an inner layer of the printed circuit card 1. The conductor tracks 4 and 5 are electrically insulated from one another by the material of the printed circuit card 1. The conductor tracks 4 and 5 are formed from copper and in a comb-shaped manner in relation to one another. The two conductor tracks 4 and 5 are electrically connected to a monitoring device 8 by electrical connections 6 and 7. The monitoring device 8 detects or monitors the insulating state of the two conductor tracks 4 and 5 in relation to one another.

A number of electronic components 12 are schematically represented on the printed circuit card 1. If one of these components 12 heats up, heat is introduced directly into the material of the printed circuit card 1, which heats up increasingly. As from a certain temperature, a carbonization of the plastic material occurs, and the printed circuit card 1 locally becomes an electrical conductor. This, however, changes the insulating state of the two conductor tracks 4 and 5 in relation to one another, which are laid in the comb-shape manner. If the insulating state or resistance falls below a prescribed desired value, the monitoring device 8 produces a fault signal 10, which is routed into a protective device 11 to interrupt an electrical supply 14. The protective device 11 disconnects the electrical supply 16 to the printed circuit card 1. A smoldering electrical fire caused by the self-feeding process of the carbonization is prevented at an early stage, to be precise even before electrically caused smoke or toxic fumes present a risk to the surroundings. The carbonization sensor 3 responds at an early time to local changes in resistance.

Figure 2:
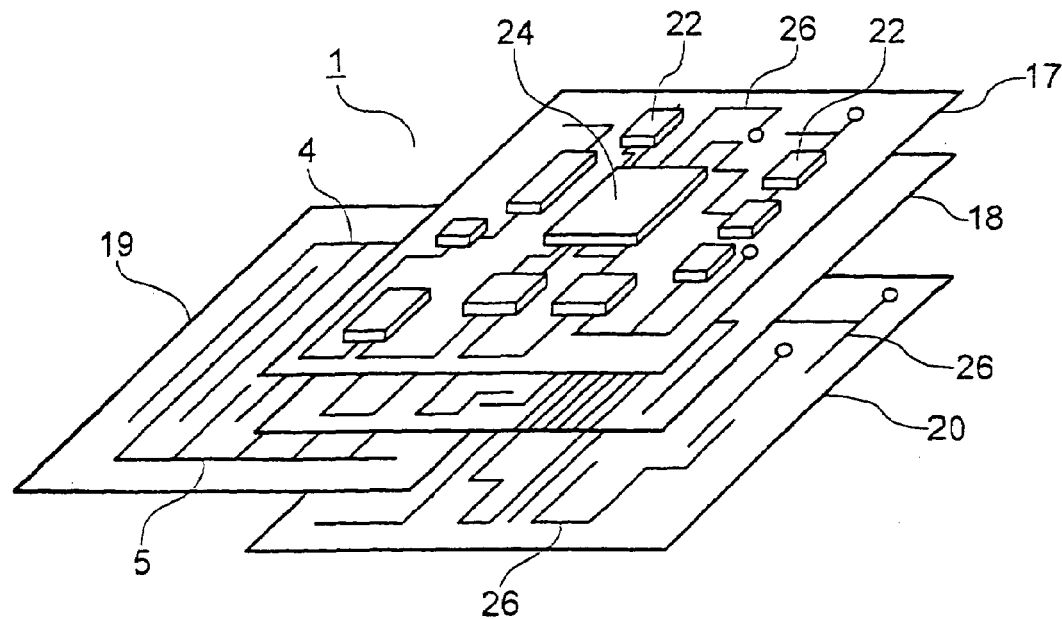
FIG. 2 is a diagrammatic, exploded perspective view of a multilayered printed circuit card, the conductor tracks of the carbonization sensor being laid in an inner layer.

FIG. 2 shows a multilayered printed circuit card 1 in a perspective representation. For clarification, individual layers 17, 18, 19, 20 of the printed circuit card 1 are shown individually and separated from one another. In a real multilayered printed circuit card 1, the individual layers respectively contain separate circuit tracks 26, which are formed into the material of the printed circuit card 1, in particular into an epoxy resin reinforced with glass fibers, lying one above the other. They are referred to as inner layers 18 and 19 and outer layers 17 and 20. Electronic components 22 disposed on the outer layers 17 and 20 are partly plated through to the corresponding circuit tracks of the inner layers. Shown by way of example on the outer layer 17 as a power component is an IC, which develops a large amount of heat.

On the inner layer 19, the conductor tracks 4 and 5 of the carbonization sensor are disposed in a comb-shaped manner in relation to one another. Apart from plated-through holes that are provided, no account has to be taken of existing circuit tracks 26 in layers of the printed circuit card 1 lying above or below. The comb-shaped conductor tracks 4 and 5 are integrated as an additional layer of the printed circuit card 1 in the production process of the latter.

If, on account of a defect of the IC 24, there is excessive heating, as from a certain temperature this leads to a carbonization of the material lying thereunder of the printed circuit card 1. This, however, also changes the insulating state of the conductor tracks 4 and 5 in the inner layer 19 in relation to one another. A smoldering fire can be avoided quickly and reliably.

Figure 3:
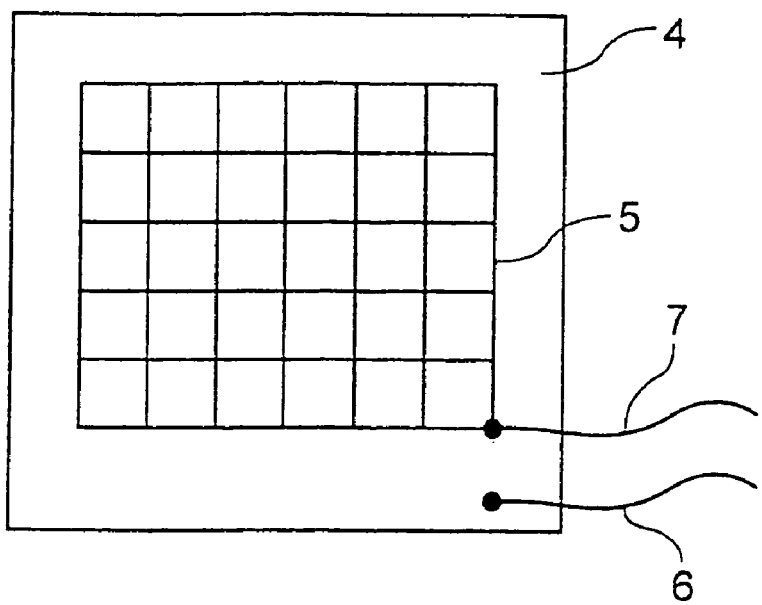
FIG. 3 is an illustration of a first configuration of the conductor tracks of the carbonization sensor.

FIG. 3 shows a first configuration of the conductor tracks 4 and 5, as they are suited in particular for measuring the ohmic resistance in relation to one another as a measure of the insulating state. One conductor track, that is the conductor track 4, is in this embodiment configured so as to cover a surface area as a so-called "plane". The other conductor track 5 is formed in the form of a grid. Between the two conductor tracks 4 and 5 is the material of the printed circuit card. The two connections 6 and 7 lead to the connected monitoring device.

If an overheated component leads locally at any point to a carbonization of the material of the printed circuit card located between the conductor tracks 4 and 5, the ohmic resistance between the conductor tracks 4 and 5 changes on account of the planar configuration. The carbonization leads locally to a "short-circuit" between the conductor tracks 4 and 5, which can be detected on the basis of a measurement of the ohmic resistance. The detection may be performed for example in such a way that a fault signal is triggered by the monitoring device when the ohmic resistance falls below a minimum value for it, which signal can be used for disconnecting the electrical supply to the printed circuit card. A favorable minimum value for the resistance lies for instance between 10 kΩ and several MΩ.

Figure 4:
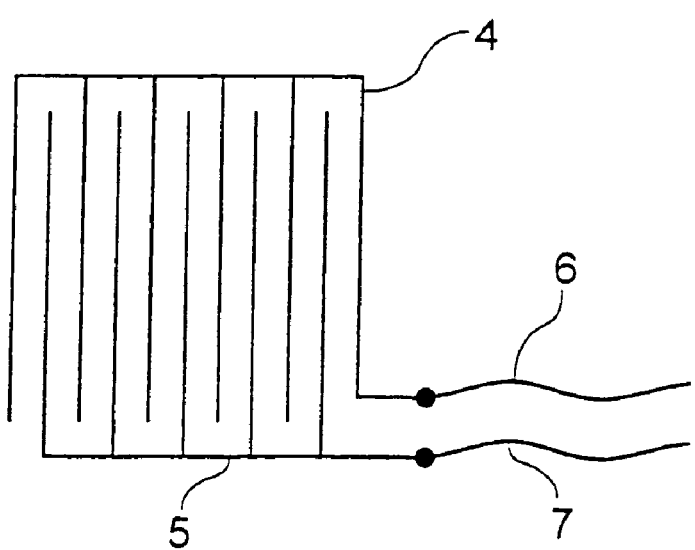
FIG. 4 is an illustration of a second configuration of the conductor tracks of the carbonization sensor.

Another configuration of the conductor tracks 4 and 5 is represented in FIG. 4, as they are suited in particular for detecting the insulating state of the conductor tracks 4 and 5 in relation to one another in a plane. The two conductor tracks are configured in a comb-shaped manner, the teeth of the combs respectively engaging in one another. The conductor tracks are in this case spaced apart from one another by the material of the printed circuit card. The electrical connections 6 and 7 are in turn routed to the external monitoring device. Carbonization caused by an overheated component has the effect of changing the material of the printed circuit card locally from an electrical insulator to an electrical conductor. The impedance of the conductor tracks 4 and 5 changes and can be picked up or detected, for example by an A.C. circuit.

Figure 5:
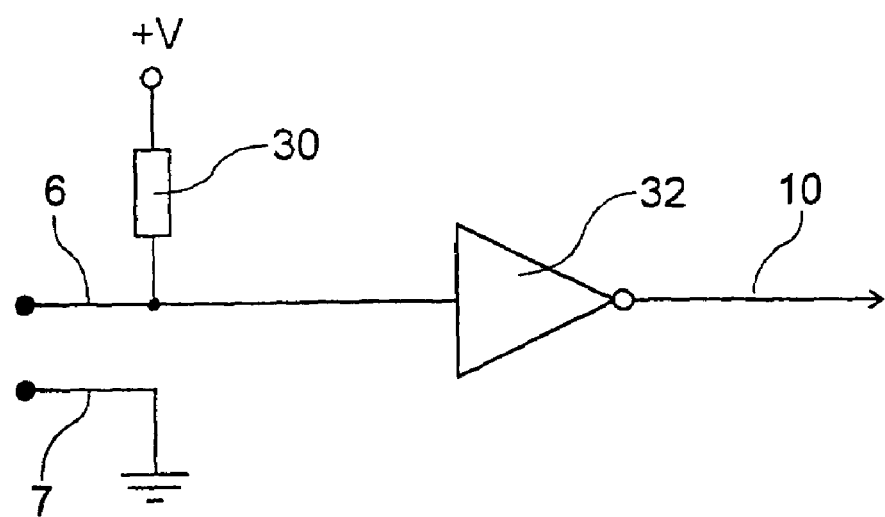
FIG. 5 is a circuit diagram of a D.C. circuit for the detection of the ohmic resistance of the conductor tracks of the carbonization sensor.

A basic diagram of an electric circuit for detecting the ohmic resistance of the conductor tracks of the carbonization sensor is shown in FIG. 5. Connected to the electrical connections 6 and 7 are the conductor tracks 4 and 5, as shown for example in FIG. 3. One conductor track is grounded via the connection 7. The other conductor track is connected to a potential V+ via the connection 6 and a resistor 30. A digital inverter 32 amplifies the voltage dropping across the resistance formed by the conductor tracks. The output signal of the digital inverter 32 may be used as the fault signal 10.

Figure 6:
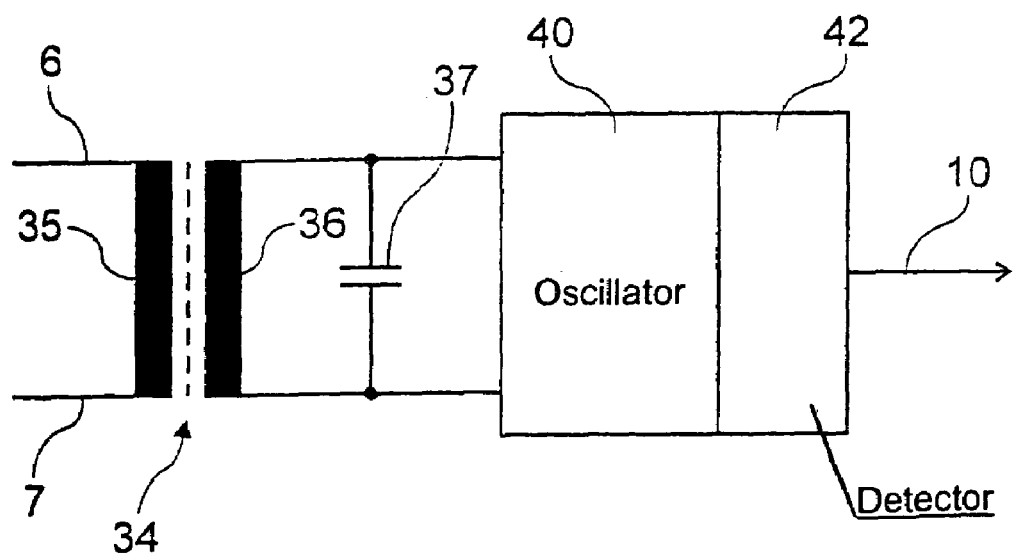
FIG. 6 is a circuit diagram of an A.C. circuit for the detection of the capacitance of the conductor tracks of the carbonization sensor.

In FIG. 6, the basic diagram of an A.C. circuit for detecting the impedance of the conductor tracks of the carbonization sensor is drawn. The conductor tracks are connected via the connections 6 and 7 to a secondary coil 35 of a transformer 34. The conductor tracks are configured in a way corresponding to FIG. 4. A capacitor formed by the conductor tracks 4, 5 of the carbonization sensor and the inductance of the transformer 34 form an oscillating circuit, which performs damped oscillations. The oscillating circuit is excited via a primary coil 36 of the transformer 34. Ideally, for energy-related reasons, the excitation takes place at the resonant frequency of the oscillating circuit. To produce the corresponding frequency, an oscillator 40 is provided, and monitored by a detector circuit 42. Connected in parallel with the coil 36 in the exemplary embodiment is the capacitor 37, by which the oscillating frequency can be changed. This capacitor 37 could alternatively also be connected in parallel with the coil 35. The carbonization sensor is separated from the monitoring circuit by the transformer 34.

The oscillating behavior of the oscillating circuit is analyzed by the detector circuit 42. If carbonization takes place locally in the printed circuit card, the impedance of the sensor formed by the conductor tracks changes. If a local short-circuit takes place, the sensor is bridged. The oscillation in the oscillator circuit breaks off. The detector circuit 42 emits a fault signal 10.

This application claims the priority, under 35 U.S.C. § 119, of German patent application No. 10 2004 033 261.4, filed Jul. 9, 2004; the entire disclosure of the prior application is herewith incorporated by reference.

I claim:

1. A printed circuit card, comprising:
a printed circuit card body made of plastic;
a carbonization sensor for protection against smoldering electrical fires disposed on said printed circuit card body, said carbonization sensor having a first conductor track and a second conductor track disposed on said printed circuit card body, said first and second conductor tracks being electrically insulated from one another by said plastic, said first and second conductor tracks forming and defining a capacitor;
a monitoring device connected to said carbonization sensor and having a detector circuit, said monitoring device monitoring an insulating state of said first and second conductor tracks in relation to one another and producing a fault signal if the insulating state is violated; and
a transformer having an inductance and connected to said detector circuit, said first and second conductor tracks and said inductance of said transformer forming an oscillating circuit being excited by said transformer through said detector circuit, an oscillating behavior of said oscillating circuit being detected by said detector circuit, said detector circuit generating the fault signal when oscillation breaks off.

2. The printed circuit card according to claim 1, further comprising a protective device for receiving the fault signal and connected to said monitoring device, said protective device, upon receiving the fault signal interrupts an electrical supply.

3. The printed circuit card according to claim 1, wherein said printed circuit card body has a number of layers, said first and second conductor tracks of said carbonization sensor being laid in an inner layer of said number of layers.

4. The printed circuit card according to claim 1, wherein one of said first and second conductor tracks covers a given surface area and the other of said first and second conductor tracks being formed opposite it and in a form of a grid.

5. The printed circuit card according to claim 1, wherein said first and second conductor tracks being formed in a comb-shaped manner in relation to one another.

6. The printed circuit card according to claim 1, wherein said detector circuit is operated at a resonant frequency of said oscillating circuit.

7. The printed circuit card according to claim 1, wherein said transformer is disposed on said printed circuit card body.

8. A printed circuit card, comprising:
a printed circuit card body made of plastic;
a carbonization sensor for protection against smoldering electrical fires disposed on said printed circuit card body, said carbonization sensor having a first conductor track and a second conductor track disposed on said printed circuit card body, said first and second conductor tracks being electrically insulated from one another by said plastic;
a monitoring device connected to said carbonization sensor, said monitoring device monitoring an insulating state of said first and second conductor tracks in relation to one another and producing a fault signal if the insulating state is violated; and
components to be monitored and disposed on said printed circuit card body in a same plane as said first and second conductor tracks, said first and second conductor tracks being routed such that they pass close by said components to be monitored.

9. The printed circuit card according to claim 8, wherein said monitoring device includes a D.C. circuit for detecting an ohmic resistance between said first and second conductor tracks and producing the fault signal when the ohmic resistance falls below a prescribed minimum resistance.

10. The printed circuit card according to claim 8, wherein said components include power components.

11. A printed circuit card, comprising:
a printed circuit card body made of plastic;
a carbonization sensor for protection against smoldering electrical fires disposed on said printed circuit card body, said carbonization sensor having a first conductor track and a second conductor track disposed on said printed circuit card body, said first and second conductor tracks being electrically insulated from one another by said plastic;
a monitoring device connected to said carbonization sensor, said monitoring device monitoring an insulating state of said first and second conductor tracks in relation to one another and producing a fault signal if the insulating state is violated, said monitoring device having an A.C. circuit monitoring an impedance formed by said first and second conductor tracks and produces the fault signal when the impedance falls below a prescribed minimum value.

* * * * *